(12) United States Patent
Isomura et al.

(10) Patent No.: US 9,748,124 B2
(45) Date of Patent: Aug. 29, 2017

(54) VACUUM PROCESSING APPARATUS AND OPERATING METHOD THEREOF

(71) Applicant: Hitachi High-Technologies Corporation, Minato-ku, Tokyo (JP)

(72) Inventors: Ryoichi Isomura, Tokyo (JP); Yutaka Kudo, Tokyo (JP); Takahiro Shimomura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 543 days.

(21) Appl. No.: 14/183,645

(22) Filed: Feb. 19, 2014

(65) Prior Publication Data
US 2014/0271049 A1    Sep. 18, 2014

(30) Foreign Application Priority Data
Mar. 14, 2013  (JP) .................. 2013-051971

(51) Int. Cl.
*H01L 21/67*    (2006.01)
(52) U.S. Cl.
CPC .. *H01L 21/67184* (2013.01); *H01L 21/67196* (2013.01)
(58) Field of Classification Search
CPC ................... H01L 21/67184; H01L 21/67196
See application file for complete search history.

(56) References Cited

U.S. PATENT DOCUMENTS 7,022,613 B2 * 4/2006 Pomarede ......... H01L 21/67017
118/719
7,024,266 B2 * 4/2006 Edo .................. G03F 7/7075
700/112
8,029,226 B2 * 10/2011 van der Meulen .................
H01L 21/67167
414/217
8,747,046 B2 * 6/2014 Isomura ............ H01L 21/67184
414/217
9,385,015 B2 * 7/2016 Yamawaku ....... H01L 21/67196
(Continued)

FOREIGN PATENT DOCUMENTS

| JP | 2012074496 A | * | 4/2012 |
| JP | 2012-138542 A |  | 7/2012 |
| JP | 2012138542 A | * | 7/2012 |

*Primary Examiner* — Kaitlin Joerger
(74) *Attorney, Agent, or Firm* — Miles & Stockbridge P.C.

(57) ABSTRACT

An operating ratio is improved in a vacuum processing apparatus to which a plurality of vacuum transfer chambers are connected through a vacuum transfer intermediate chamber.

In a method of operating the vacuum processing apparatus having the plurality of vacuum transfer chambers connected through the vacuum transfer intermediate chamber and a plurality of vacuum processing vessels connected to the vacuum transfer chambers, respectively, the plurality of vacuum transfer chambers are made to communicate through the vacuum transfer intermediate chamber, a purge gas is supplied to the vacuum transfer chamber connected to a lock chamber in the plurality of vacuum transfer chambers, an inside of the transfer chamber of the vacuum transfer chamber which is far from the lock chamber is decompressed/exhausted, and pressures in all the transfer chambers of the plurality of vacuum transfer chambers are raised to be higher than the pressure in the vacuum processing vessel.

6 Claims, 3 Drawing Sheets

(56) References Cited

U.S. PATENT DOCUMENTS

| | | | |
|---|---|---|---|
| 2008/0138176 A1* | 6/2008 | Kim | H01L 21/67173 |
| | | | 414/217 |
| 2008/0170970 A1* | 7/2008 | Ito | G05D 16/2013 |
| | | | 422/112 |
| 2010/0297786 A1* | 11/2010 | Terashima | C30B 25/08 |
| | | | 438/16 |
| 2011/0110752 A1* | 5/2011 | Tauchi | H01L 21/67184 |
| | | | 414/217 |
| 2012/0027542 A1* | 2/2012 | Isomura | H01L 21/67742 |
| | | | 414/217 |
| 2012/0163943 A1* | 6/2012 | Isomura | H01L 21/67742 |
| | | | 414/217 |
| 2013/0343841 A1* | 12/2013 | van der Meulen | H01L 21/677 |
| | | | 414/217 |

* cited by examiner

VACUUM PROCESSING APPARATUS AND OPERATING METHOD THEREOF

The present application is based on and claims priority of Japanese patent application No. 2013-051971 filed on Mar. 14, 2013, the entire contents of which is hereby incorporated by reference.

BACKGROUND OF THE INVENTION

Field of the Invention

The present invention relates to a vacuum processing apparatus and an operating method thereof, and particularly to a vacuum processing apparatus constituted by connecting a plurality of vacuum transfer chambers and an operating method suitable for the vacuum processing apparatus.

Description of the Related Art

As a prior-art vacuum processing apparatus, the applicant discloses a vacuum processing apparatus, as described in Japanese Patent Laid-Open Publication No. 2012-138542 (Patent Document 1), provided with first and second vacuum transfer chambers in which a wafer is transferred through the vacuum transfer chambers, first and second vacuum processing vessels connected to each of these vacuum transfer chambers, respectively, a vacuum transfer intermediate chamber capable of accommodating the wafer therein by being connected between the first and second vacuum transfer chambers, a lock chamber having an inside made to communicate and connected to the first vacuum transfer chamber, and a plurality of valves for airtight opening/closing arranged between the first and second vacuum transfer chambers and each of the first and second vacuum processing vessels, the vacuum transfer intermediate chamber vessel, and the lock chamber, and before opening the valve between a processing vessel of the first vacuum processing vessel and the vacuum transfer chamber of the first vacuum transfer chamber or between a processing vessel of the second vacuum processing vessel and the vacuum transfer chamber of the second vacuum transfer chamber, any one of the valves arranged between the first and second vacuum transfer chambers is closed so as to obtain a highly reliable vacuum processing apparatus.

In the aforementioned prior-art technology, if the wafer is processed in each of the processing vessels or in the transfer chamber or is transferred by a vacuum transfer robot, the processing vessel or the transfer chamber in which the wafer is transferred is completely separated and made independent by the valve arranged between that and another processing vessel or the transfer chamber and is configured to be capable of executing pressure control. In the prior-art technology, by employing such configuration, secondary contamination of the apparatus or the wafer due to outflow of an atmosphere from the processing vessel can be prevented.

However, in the aforementioned prior-art technology, the following points are not sufficiently considered, which causes a problem. That is, in a case in which the plurality of vacuum transfer chambers are connected through the intermediate vessel, and while the wafer is transferred, each of the transfer chambers is separated by the valve arranged in the intermediate vessel and controlled so that the plurality of processing vessels do not communicate with each other at the same time, productivity deterioration of the entire apparatus caused by transfer standby time of the wafer due to opening/closing time of the valve arranged between the vacuum transfer chamber and the intermediate vessel is not sufficiently considered, and a production amount per installation area of the vacuum processing apparatus is undermined.

The present invention has an object to provide a method of operating a semiconductor producing apparatus which has high productivity per installation area.

SUMMARY OF THE INVENTION

A vacuum processing apparatus of the present invention is a vacuum processing apparatus provided with a plurality of vacuum transfer chambers connected through a vacuum transfer intermediate chamber and a plurality of vacuum processing vessels connected to the vacuum transfer chambers, respectively, in which a certain path is constituted so that: the plurality of vacuum transfer chambers are made to communicate through the vacuum transfer intermediate chamber, a purge gas is supplied to the vacuum transfer chamber connected to a lock chamber in the plurality of vacuum transfer chambers, an inside of a transfer chamber of the vacuum transfer chamber which is the farthest from the lock chamber is decompressed/exhausted, and the purge gas introduced into the vacuum transfer chamber connected to the lock chamber is exhausted.

Moreover, in the vacuum processing apparatus of the present invention, a pressure in the processing chamber of the plurality of vacuum processing chambers is lower than a reduced pressure of the vacuum transfer chamber.

Moreover, the vacuum processing apparatus of the present invention is a vacuum processing apparatus provided with a lock chamber connected to and arranged in an atmospheric air transfer portion, a first vacuum transfer vessel connected to and arranged in the lock chamber and transferring a sample in a decompressed transfer chamber therein, a first inactive gas supplying device for supplying an inactive gas into the first vacuum transfer vessel, a first vacuum exhaust device connected to the first vacuum transfer vessel, a first processing vessel connected to and arranged in the first vacuum transfer vessel and processing the sample in the decompressed processing chamber therein, a vacuum transfer intermediate chamber connected to and arranged in the first vacuum transfer vessel, a second vacuum transfer vessel connected to and arranged in the vacuum transfer intermediate chamber and transferring the sample in the decompressed transfer chamber therein, a second inactive gas supplying device for supplying the inactive gas into the second vacuum transfer vessel, a second vacuum exhaust device connected to the second vacuum transfer vessel, and a second processing vessel connected to and arranged in the second vacuum transfer vessel and processing the sample in the decompressed processing chamber therein, and in a state in which a gate valve leading to the vacuum transfer intermediate chamber is opened so that the first and second vacuum transfer vessels communicate with the vacuum transfer intermediate chamber, gas supply from the second inactive gas supplying device is stopped, the inactive gas is supplied from the first inactive gas supplying device to the first vacuum transfer vessel, vacuum exhaust by the first vacuum exhaust device is stopped, and the second vacuum transfer vessel is decompressed/exhausted by the second vacuum exhaust device.

A method of operating the vacuum processing apparatus of the present invention is a method of operating the vacuum processing apparatus having the plurality of vacuum transfer chambers connected through the vacuum transfer intermediate chamber and the plurality of vacuum processing chambers connected to the vacuum transfer chambers, respectively, in which the plurality of vacuum transfer chambers are made to communicate through the vacuum transfer intermediate chamber, a purge gas is supplied to the vacuum transfer chamber connected to the lock chamber in the plurality of vacuum transfer chambers, and the inside of the transfer chamber of the vacuum transfer chamber which is far from the lock chamber is decompressed/exhausted.

Moreover, in the method of operating the vacuum processing apparatus of the present invention, a pressure in the processing chamber of the plurality of vacuum processing chambers is lower than a decompressed pressure of the vacuum transfer chamber.

Moreover, the method of operating the vacuum processing apparatus of the present invention is, in a method of operating the vacuum processing apparatus provided with a lock chamber connected to and arranged in an atmospheric air transfer portion, a first vacuum transfer vessel connected to and arranged in the lock chamber and transferring a sample in a decompressed transfer chamber therein, a first inactive gas supplying device for supplying an inactive gas into the first vacuum transfer vessel, a first vacuum exhaust device connected to the first vacuum transfer vessel, a first processing vessel connected to and arranged in the first vacuum transfer vessel and processing the sample in the decompressed processing chamber therein, a vacuum transfer intermediate chamber connected to and arranged in the first vacuum transfer vessel, a second vacuum transfer vessel connected to and arranged in the vacuum transfer intermediate chamber and transferring the sample in the decompressed transfer chamber therein, a second inactive gas supplying device for supplying the inactive gas into the second vacuum transfer vessel, a second vacuum exhaust device connected to the second vacuum transfer vessel, and a second processing vessel connected to and arranged in the second vacuum transfer vessel and processing the sample in the decompressed processing chamber therein, when the sample is to be processed by using the first and second processing vessels, in a state in which a gate valve leading to the vacuum transfer intermediate chamber is opened so that the first and second vacuum transfer vessels communicate with the vacuum transfer intermediate chamber, gas supply from the second inactive gas supplying device is stopped, the inactive gas is supplied from the first inactive gas supplying device to the first vacuum transfer vessel, vacuum exhaust by the first vacuum exhaust device is stopped, and the second vacuum transfer vessel is decompressed/exhausted by the second vacuum exhaust device.

According to the vacuum processing apparatus and the operating method thereof according to the present invention, by maintaining an open state of the gate valve of the vacuum transfer intermediate chamber, a vacuum transfer robot provided in each of the vacuum transfer chambers can carry in/out a wafer to/from the vacuum transfer intermediate chamber immediately without waiting for an opening/closing operation of the gate valve, and improvement of the number of wafers that can be processed per unit time can be realized.

DETAILED DESCRIPTION OF THE PREFERRED EMBODIMENTS

An embodiment of a vacuum processing apparatus and an operating method thereof according to the present invention will be described below in detail by using the attached drawings.

Figure 1:
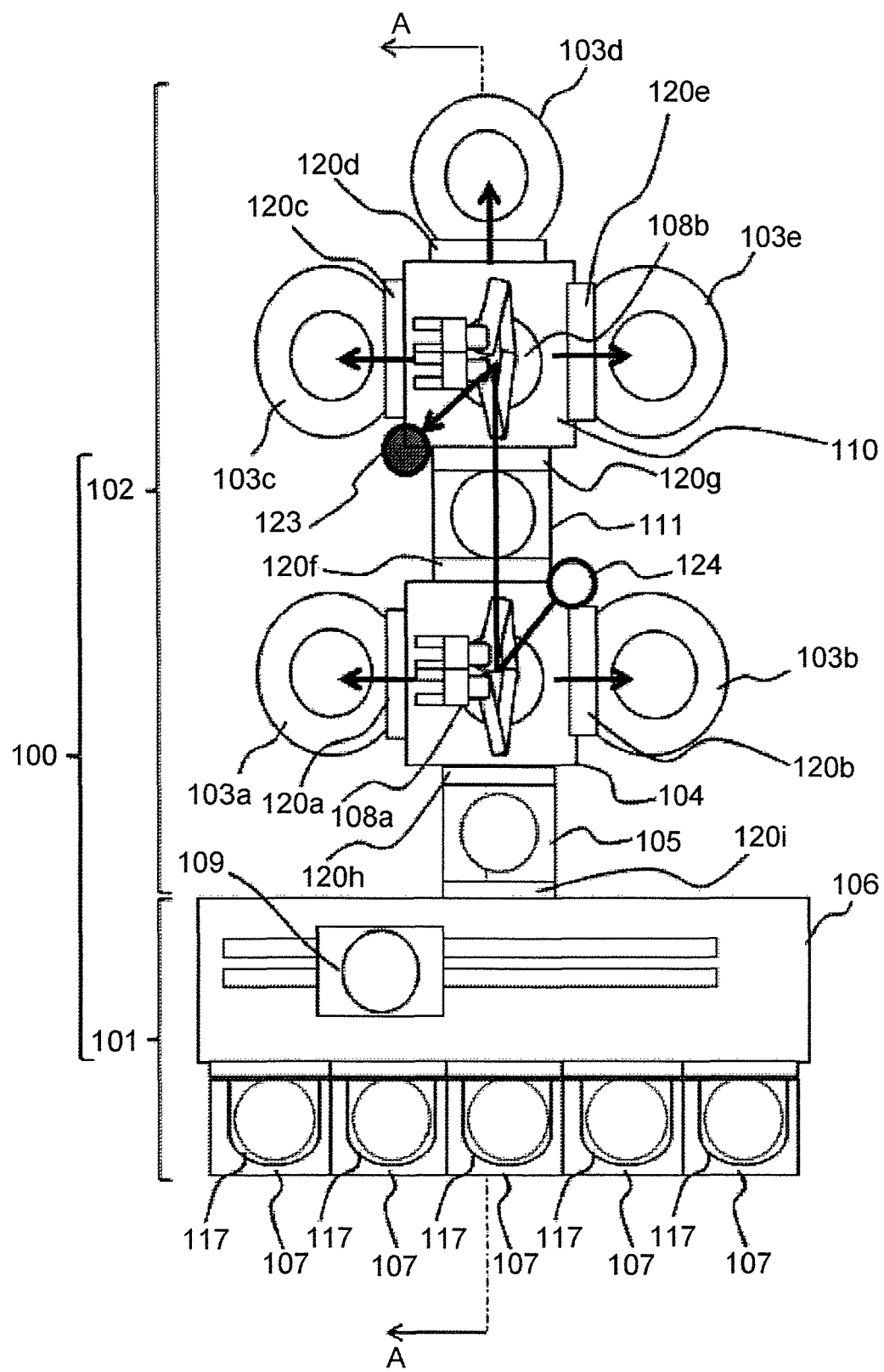
FIG. 1 is a plan view illustrating a vacuum processing apparatus which is an embodiment of the present invention.

FIG. 1 is an upper view for explaining an outline of a configuration of an entire vacuum processing apparatus 100 according to the embodiment of the present invention.

The vacuum processing apparatus 100 provided with a plurality of vacuum processing vessels 103a to 103e according to the embodiment of the present invention illustrated in FIG. 1 is roughly composed of an atmospheric-side block 101 and a vacuum-side block 102. The atmospheric-side block 101 is a portion where a sample having a substrate shape such as a semiconductor wafer and the like which is to be processed under an atmospheric pressure is transferred, positioned for accommodation and the like, while the vacuum-side block 102 is a block in which the sample having a substrate shape such as a wafer and the like is transferred in a pressure reduced from the atmospheric pressure and processed in a predetermined vacuum processing vessel (at least one of 103a to 103e). Between the vacuum-side block 102 where the aforementioned transfer and processing are performed on the vacuum-side block 102 and the atmospheric-side block 101, a section (lock chamber 105) is arranged by connecting them for reducing its internal pressure to a vacuum pressure or for raising the pressure to the atmospheric pressure in a state in which the sample is accommodated therein.

The atmospheric-side block 101 has a substantially cuboid housing 106 provided with an atmospheric-side transfer robot 109 therein, and a plurality of cassettes 117 mounted on a front surface side (lower side in FIG. 1) of this housing 106 and each accommodating a sample having a substrate shape such as a semiconductor wafer and the like to be processed for processing or cleaning (hereinafter referred to as a wafer) are placed and provided on each of cassette bases 107.

The vacuum-side block 102 is provided with a first vacuum transfer chamber 104, a second vacuum transfer chamber 110, and one or a plurality of lock chambers 105 arranged between that and the atmospheric-side block 101 and exchanging a pressure between the atmospheric pressure and the vacuum pressure in a state having a wafer to be exchanged between the atmospheric side and the vacuum side therein. This lock chamber 105 is a vacuum vessel whose space inside can be adjusted to the vacuum pressure or the atmospheric pressure, in which a passage through which the wafer passes and is transferred toward the connected section and gate valves 120i and 120h capable of opening/closing and airtightly sealing it are arranged, and airtightly divides into the atmospheric side and the vacuum side. Moreover, the space inside the lock chamber 105 is provided with an accommodating portion (details are not shown) capable of accommodating and holding the plurality of wafers with gaps above and below them, which is closed by the gate valve 120i in a state accommodating these wafers and made airtight with respect to the atmospheric air.

The first vacuum transfer chamber 104 and the second vacuum transfer chamber 110 are units including vacuum vessels, each planar shape having a substantially rectangular shape, and they are two units having a difference in configuration to such a degree that can be considered substantially identical. The first vacuum transfer chamber 104 and the second vacuum transfer chamber 110 are provided with a purge line 124, and by introducing a purge gas such as an inactive gas or the like into the first vacuum transfer chamber 104 while its flow rate is controlled upon receipt of an instruction from a control portion, not shown, a pressure can be adjusted to a relatively lower pressure, the same pressure or a relatively higher pressure than the other vacuum processing vessels 103a to 103e and the vacuum transfer intermediate chamber 111.

The vacuum transfer intermediate chamber 111 is a vacuum vessel whose inside can be decompressed to a pressure relatively higher than the other vacuum processing vessels, in which the chambers inside are allowed to communicate with each other by connecting the first and second vacuum transfer chambers 104 and 110. Between the vacuum transfer intermediate chamber 111 and each of the vacuum transfer chambers 104 and 110, gate valves 120f and 120g for opening/shutting down and dividing a passage for allowing the chambers therein communicate with each other and through which the wafers are transferred are arranged, and by closing these gate valves 120f and 120g, the spaces between the vacuum transfer intermediate chamber 111 and the first vacuum transfer chamber 104 as well as between the vacuum transfer intermediate chamber 111 and the second vacuum transfer chamber 110 are sealed airtightly. The vacuum transfer intermediate chamber 111 is not provided with a purge mechanism or an exhaust mechanism and is a chamber functioning only as a path of a wafer when the wafer is transferred from one of the vacuum transfer chamber to the other vacuum transfer chamber.

The first vacuum transfer chamber 104 is configured so that two vacuum processing vessels 103a and 103b can be connected. On the other hand, the second vacuum transfer chamber 110 is configured so that three vacuum processing vessels 103c, 103d, and 103e can be connected.

Moreover, inside the vacuum transfer intermediate chamber 111, an accommodating portion, not shown, for placing the plurality of wafers with a gap between their surfaces and holding them horizontally is arranged and is provided with a function of a relay chamber for accommodating the wafers once when the wafer is delivered between the first vacuum transfer chamber 104 and the second vacuum transfer chamber 110. That is, the wafer transferred by either of the vacuum transfer robot 108a or 108b in the one of the vacuum transfer chambers and placed on the accommodating portion is carried out by either one of the vacuum transfer robot 108b or 108a in the other vacuum transfer chamber and transferred to the vacuum processing vessels 103a to 103e or the lock chamber 105 connected to the vacuum transfer chamber (104 or 110).

Between side walls corresponding to facing surfaces of the first vacuum transfer chamber 104 and the second vacuum transfer chamber 110, the vacuum transfer intermediate chamber 111 is arranged and connects the both. Moreover, on the other surfaces, each of the vacuum processing vessels 103a to 103e decompressed therein and the wafer is transferred thereinto for processing the wafer is connected. In this embodiment, the vacuum processing vessels 103a to 103e refer to the entire unit including generating means of an electronic field and a magnetic field, not shown, respectively, and the exhaust means including the vacuum pump for exhausting the space to be decompressed in the vessel in addition to the vacuum vessel, and inside the processing vessel, etching processing, ashing processing or other types of processing to be applied to the semiconductor wafers are executed. Moreover, to each of the vacuum processing vessels 103a to 103e, a pipeline, not shown, through which a processing gas supplied in accordance with the processing to be executed flows is connected. Each of the vacuum processing vessels 103a to 103e is capable of decompression to a pressure relatively lower than any of the internal pressures of the first vacuum transfer chamber 104, the second vacuum transfer chamber 110, and the vacuum transfer intermediate chamber 111 under control of the pressure by the control portion, not shown.

The first vacuum transfer chamber 104 and the second vacuum transfer chamber 110 have their insides made transfer chambers, and in the first vacuum transfer chamber 104, the vacuum transfer robot 108a for transferring the wafer between the lock chamber 105 and any one of the vacuum processing vessel 103a, 103b or the vacuum transfer intermediate chamber 111 under a vacuum environment is arranged at a center part in the space therein. In the second vacuum transfer chamber 110, too, the vacuum transfer robot 108b is arranged at the center part therein and transfers the waver between any one of the vacuum processing vessels 103c to 103e and the vacuum transfer intermediate chamber 111. Configurations of these vacuum transfer robots 108a and 108b are the same. Regarding the vacuum transfer robots 108a and 108b, the wafer is placed on the arm thereof and the wafer is carried in/carried out between on the wafer base arranged in the vacuum processing vessels 103a or 103b in the first vacuum transfer chamber 104 or the lock chamber 105 or the vacuum transfer intermediate chamber 111. A passage allowed to communicate by the gate valves 120a to 120h which can be airtightly closed/opened is provided among the vacuum processing vessels 103a to 103e, the lock chamber 105, the vacuum transfer intermediate chamber 111, and the transfer chambers of the first vacuum transfer chamber 104 and the second vacuum transfer chamber 110, respectively.

Figure 2:
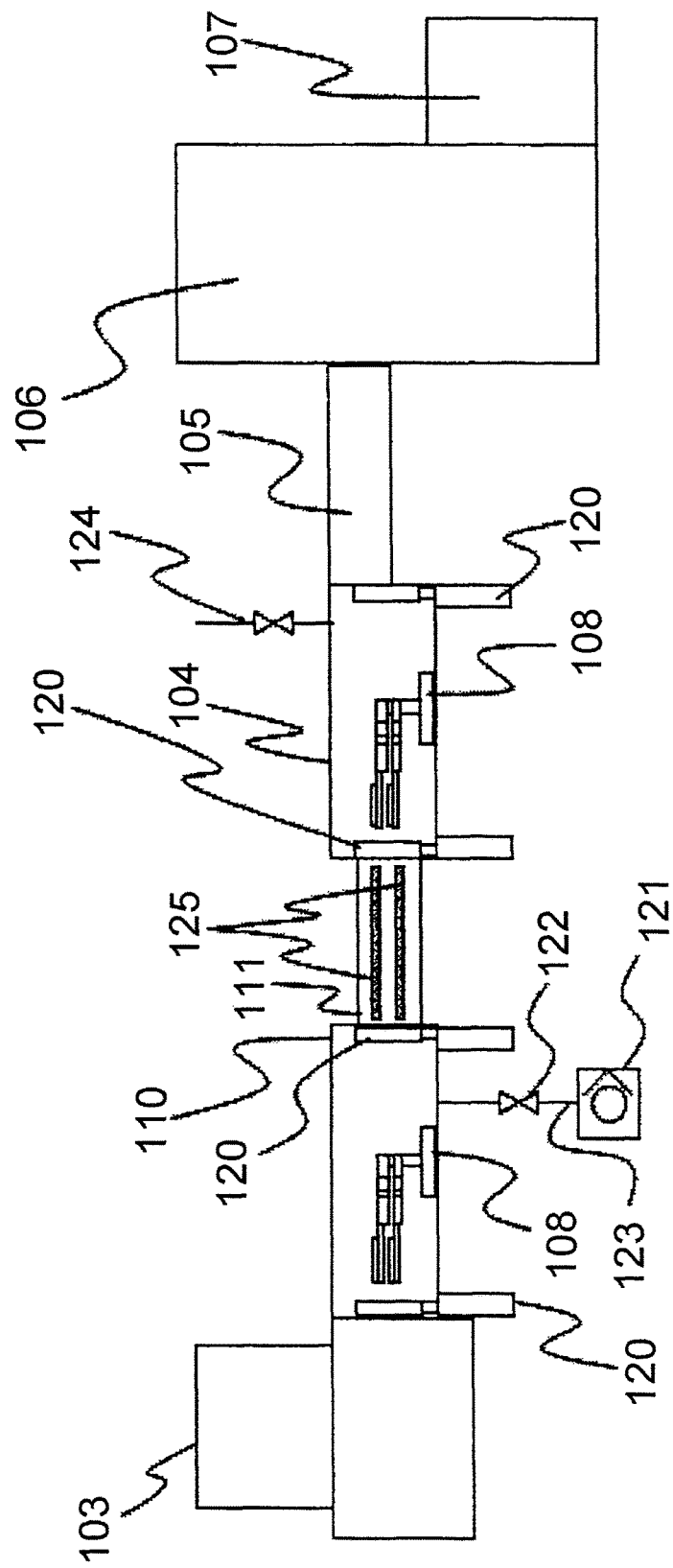
FIG. 2 is an A-A longitudinal sectional view of the vacuum processing apparatus in FIG. 1.

FIG. 2 is an A-A longitudinal sectional view of the vacuum processing apparatus 100 in FIG. 1. As illustrated in FIG. 2, the first vacuum transfer chamber 104 is provided with the purge line 124, and the second vacuum transfer chamber 110 is provided with a dry pump 121, a valve 122, and an exhaust pipeline 123. In the vacuum transfer intermediate chamber 111, a wafer 125 is held with a positional relationship in which the wafer 125 is vertically offset on a wafer support base, not shown.

Figure 3:
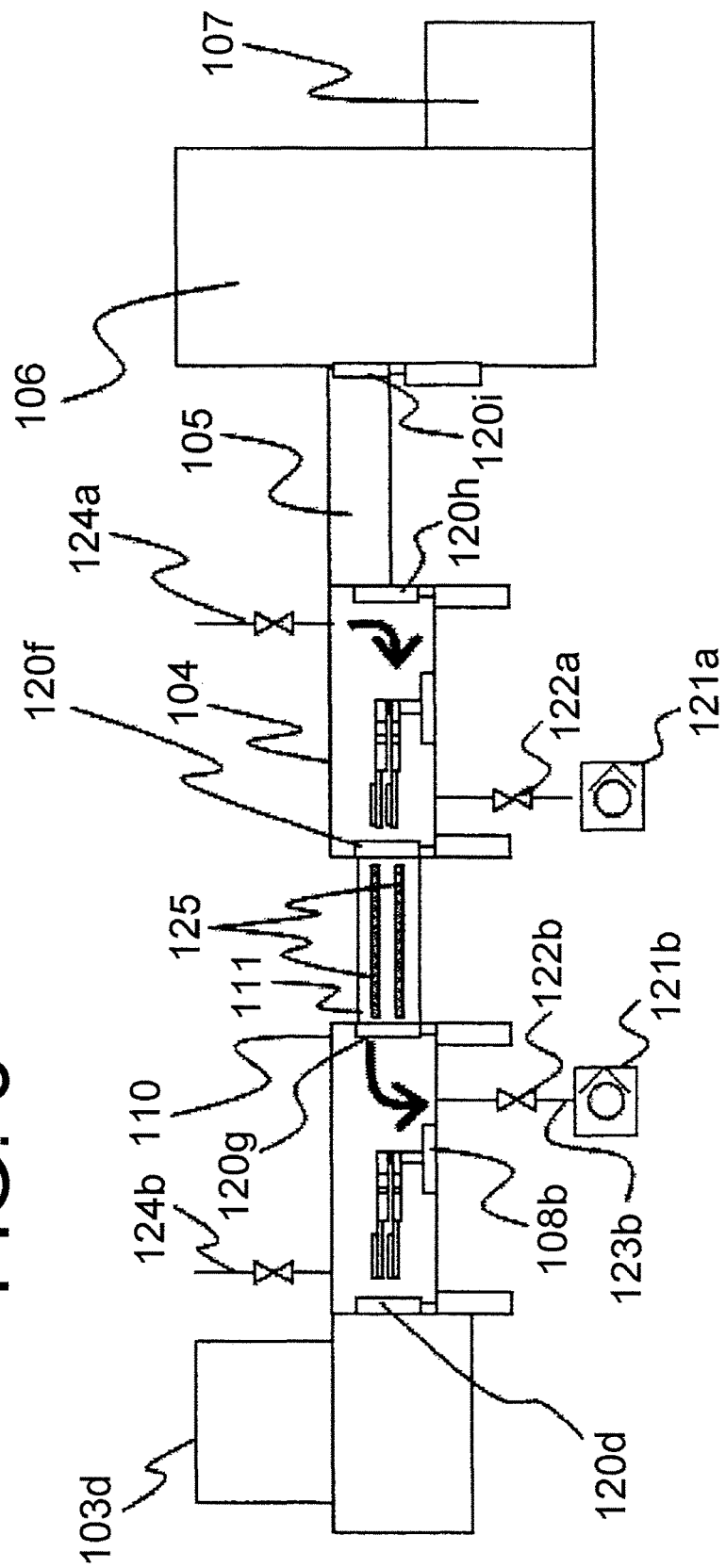
FIG. 3 is the A-A longitudinal sectional view of another embodiment of the vacuum processing apparatus in FIG. 1.

FIG. 3 is an A-A longitudinal sectional view of another embodiment of the vacuum processing apparatus 100 similar to FIG. 1. As illustrated in FIG. 3, the first vacuum transfer chamber 104 is provided with a dry pump 121a, a valve 122a, an exhaust pipeline 123a, and a purge line 124a. Similarly, the second vacuum transfer chamber is provided with a dry pump 121b, a valve 122b, an exhaust pipeline 123b, and a purge line 124b. In the vacuum transfer intermediate chamber 111, the wafer 125 is held with a positional relationship in which the wafer 125 is vertically offset on the wafer support base, not shown.

The purge line 124a provided in the first vacuum transfer chamber 104 is controlled so as to function during wafer processing and while opened to the atmospheric air. Moreover, an exhaust line of the first vacuum transfer chamber 104 composed of the dry pump 121a, the valve 122a, and the exhaust pipeline 123a is not used except when the second vacuum transfer chamber 110 is open to the atmospheric air and either one of the gate valves 120f and 120g arranged on both ends of the vacuum transfer intermediate chamber 111 is closed.

The purge line 124*b* provided in the second vacuum transfer chamber 110 is controlled by the control portion not to be used except when the first vacuum transfer chamber 104 is open to the atmospheric air and either one of the gate valves 120*f* and 120*g* arranged on both ends of the vacuum transfer intermediate chamber 111 is closed. Moreover, the exhaust line of the second vacuum transfer chamber 110 composed of the dry pump 121*b*, the valve 122*b*, and the exhaust pipeline 123*b* is controlled so as to function during wafer processing and while being opened to the atmospheric air. The vacuum transfer intermediate chamber 111 is not provided with the purge line or the exhaust line.

In the vacuum processing apparatus having the aforementioned configuration, this embodiment is an invention of a specific example in which, in a state in which transfer time in the vacuum block 102 is longer than the transfer time in the atmospheric-side block 101, the transfer time for which the wafer is transferred on a transfer path via each of the vacuum transfer chambers, the vacuum transfer intermediate chamber, and each of the vacuum processing vessels constituting these blocks is reduced and efficiency of the processing is improved, and at the same time, an atmosphere of a processing gas or the like used when the wafer is processed in each of the vacuum processing vessels 103*a* to 103*e* is prevented from flowing into the other vacuum processing vessels or being brought into contact with (hereinafter referred to as contamination) the atmosphere of the processing gas or the like used when the wafer is processed in the other vacuum processing vessels, and production efficiency per unit time of the apparatus can be improved. Moreover, in actual processing, time of processing applied to the wafer in each of the vacuum processing vessels 103*a* to 103*e* is equal to or less than the transfer time of the wafer, and the transfer time has a larger and predominant influence on the number of processed wafers in a unit time of the entire vacuum processing apparatus 100.

Subsequently, an operation of executing processing to the wafer in such vacuum processing apparatus 100 will be described below. Since the operations in the embodiment in FIG. 2 and the embodiment in FIG. 3 are similar to each other, explanation will be made in common.

On the plurality of wafers accommodated in the cassette placed on any one of the cassette bases 107, processing is started upon receipt of an instruction from the control portion, not shown, connected to the vacuum processing apparatus 100 for controlling the operation of the vacuum processing apparatus 100 by some communication means or upon receipt of an instruction from a control portion or the like of a manufacturing line in which the vacuum processing apparatus 100 is installed. The atmospheric-side transfer robot 109 having received the instruction from the control portion takes out the specific wafer in the cassette from the cassette and transfers the taken-out wafer to the lock chamber 105.

In the lock chamber 105 which the wafer is transferred thereto and accommodated therein, the gate valve 120*h* and the gate valve 120*i* are closed, sealed, and decompressed to a predetermined pressure in a state accommodating the wafer having been transferred. Subsequently, in the lock chamber 105, the gate valve 120*h* on a side faced with the first vacuum transfer chamber 104 is opened, and the lock chamber 105 and the first vacuum transfer chamber 104 are made to communicate with each other.

The vacuum transfer robot 108*a* extends its arm into the lock chamber 105, receives the wafer in the lock chamber 105 on a wafer support portion at an arm tip end portion thereof and carries it out into the first vacuum transfer chamber 104. Moreover, the first vacuum transfer robot 108*a* transfers the wafer placed on the arm thereof to either one of the vacuum processing vessels 103*a* and 103*b* connected to the first vacuum transfer chamber 104 or any one of the vacuum processing vessels 103*c*, 103*d*, and 103*e* connected to the second vacuum transfer chamber 110 along a transfer path specified in advance by the control portion when the wafer is taken out of the cassette.

A case in which the wafer is to be transferred to the vacuum processing vessel 103*d* will be described below as an example. The wafer taken out of the lock chamber 105 is transferred to the vacuum transfer intermediate chamber 111 by the vacuum transfer robot 108*a* arranged in the first vacuum transfer chamber 104 and then, carried into the second vacuum transfer chamber 110 from the vacuum transfer intermediate chamber 111 by the vacuum transfer robot 108*b* arranged in the second vacuum transfer chamber 110 and transferred to the vacuum processing vessel 103*d*.

After the wafer is transferred to the vacuum processing vessel 103*d*, the gate valve 120*d* opening/closing a space between that and the second vacuum transfer chamber 110 connected to this vacuum processing vessel 103*d* is closed, and the vacuum processing vessel 103*d* is sealed airtightly. Subsequently, the processing gas is introduced into the vacuum processing vessel 103*d*, and the inside of this vacuum processing vessel 103*d* is adjusted to a pressure suitable for processing. An electric field or a magnetic field is supplied to the vacuum processing vessel 103*d*, whereby the processing gas is excited, and plasma is formed in this vacuum processing vessel 103*d* so that the wafer is processed.

The gate valve opening/closing a space between the vacuum processing vessel in which the wafer is processed and the vacuum transfer chamber to which this is connected is opened in a state in which the other gate valves capable of opening/closing the space including the vacuum transfer chamber and to which this is connected is closed upon receipt of the instruction from the control portion. For example, before opening of the gate valve 120*d* dividing a space between the second vacuum transfer chamber 110 and the vacuum processing vessel 103*d* to which this is connected, the control portion instructs an operation of closing or of checking of closing to the gate valves 120*c* and 120*d* of each of the vacuum processing chambers so that the vacuum processing vessel 103*d* does not communicate with the other vacuum processing vessels 103*c* and 103*e* and after the checking, it opens the valve 120*d* sealing the vacuum processing vessel 103*d*.

If it is detected that processing of the wafer in the vacuum processing vessel 103*d* is finished, it is checked that the gate valves 120*c* and 120*d* between the other vacuum processing vessels 103*c* and 103*e* and the second vacuum transfer chamber 110 are closed and the both are airtightly sealed from each other and then, the gate valve 120*d* opening/closing a space between that and the second vacuum transfer chamber 110 to which the vacuum processing vessel 103*d* is connected is opened, the vacuum transfer robot 108*b* carries out the processed wafer into the second vacuum transfer chamber 110 and transfers it to the lock chamber 105 through a transfer path opposite to the case of carrying-in of the wafer into the processing chamber.

If the wafer is transferred to the lock chamber 105, the gate valve 120*h* opening/closing a passage allowing the lock chamber 105 and the transfer chamber of the first vacuum transfer chamber 104 to communicate with each other is closed, and the pressure in the lock chamber 105 is raised to the atmospheric pressure. Subsequently, the gate valve 120*i* dividing a space between that and the inside of the housing 106 is opened, the inside of the lock chamber 105 is made to communicate with the inside of the housing 106, and the atmospheric-side transfer robot 109 transfers the wafer to the original cassette from the lock chamber 105 and returns it to an original position in the cassette.

The path of the wafer and the operation of each configuration when the wafer is processed in the vacuum processing vessel 103d is described, but the operation is the same for the processing in the other vacuum processing vessels. If the wafer is to be processed in the vacuum processing vessels 103a and 103b connected to the first vacuum transfer chamber 104, it is needless to say that the wafer does not pass through the vacuum transfer intermediate chamber 111.

Subsequently, opening/closing patterns of the gate valves 120f and 120g arranged on the both ends of the vacuum transfer intermediate chamber 111 will be described.

The gate valves 120f and 120g arranged on the both ends of the vacuum transfer intermediate chamber 111 are kept in an open state except the following cases. That is, the gate valve 120f or 120g of the vacuum transfer intermediate chamber 111 provided on the side to be opened to the atmospheric air is controlled to be closed only if the inactive gas is introduced from the purge line to one of the vacuum transfer chambers for maintenance or the like so as to return the pressure in the vacuum transfer chamber to the atmospheric state. For example, if the second vacuum transfer chamber 110 is opened to the atmospheric air for maintenance, first, the gate valve 120g on the side connected to the vacuum transfer intermediate chamber 111 provided in the second vacuum transfer chamber 110 is closed by the control portion, not shown. After the control portion, not shown, checks that the gate valve 120g is closed, the inactive gas is introduced from the purge line 124 provided in the second vacuum transfer chamber 110.

Since the vacuum transfer intermediate chamber 111 is not provided with a purge/exhaust mechanism, the both gate valves 120f and 120g arranged on the both ends of the vacuum transfer intermediate chamber 111 are not closed at the same time. That is because, if the both are closed, the pressure in the vacuum transfer intermediate chamber 111 can no longer be controlled. That is, if the gate valves 120f and 120g arranged on the both ends of the vacuum transfer intermediate chamber 111 should be controlled to be closed, after the wafer is transferred into the vacuum transfer intermediate chamber 111, control of closing either one of the gate valves 120f and 120g arranged on the both ends of the vacuum transfer intermediate chamber 111 and of opening the other is required.

Here, if the pressure of any one of the vacuum processing vessels 103a to 103e is relatively higher or equal to the first vacuum transfer chamber 104, the second vacuum transfer chamber 110, and the vacuum transfer intermediate chamber 111, that is, if it is likely that the atmosphere in the vacuum processing vessels 103a to 103e flows out to each of the vacuum transfer chambers 104 and 110 and contaminates the wafer being transferred or the other vacuum processing vessels 103a to 103e, the gate valves 120f and 120g provided on the both ends of the vacuum transfer intermediate chamber 111 need the following control under the following condition. For example, under a condition that the wafer is carried in/out in the same time slot in the vacuum processing vessel 103a connected to the first vacuum transfer chamber 104 and the vacuum processing vessel 103c connected to the second vacuum transfer chamber 110, either one of the gate valves 120f and 120g provided on the both ends of the vacuum transfer intermediate chamber 111 is controlled to be closed so that the atmosphere flowing out of each of the vacuum processing vessels 103a and 103c does not flow into the other vacuum processing vessel.

On the other hand, if the pressure of the vacuum processing vessels 103a to 103e is controlled to be relatively lower than the other vacuum transfer chambers and the vacuum transfer intermediate chamber 111, that is, if there is no chance that the atmosphere of the vacuum processing vessels 103a to 103e flows out to the vacuum transfer chamber 104 or 110, the gate valves 120f and 120g provided on the both ends of the vacuum transfer intermediate chamber 111 are controlled to be kept in the open state while the wafer is being transferred. By keeping the gate valves 120f and 120g in the open state, the vacuum transfer intermediate chamber 111 is not closed, and transfer of the wafer by the vacuum transfer robot 108a and the vacuum transfer robot 108b can be performed smoothly. A relative pressure relationship in the vacuum processing vessels 103, the first vacuum transfer chamber 104, the second vacuum transfer chamber 110, and the vacuum transfer intermediate chamber 111 in order to realize all-the-time open of the vacuum transfer intermediate chamber 111 and a method of pressure control for realizing that will be described below.

The vacuum processing vessels 103a to 103e are controlled by the control portion, not shown, so as to have a pressure relatively lower than the pressures of the first vacuum transfer chamber 104, the second vacuum transfer chamber 110, and the vacuum transfer intermediate chamber 111. At this time, there may be a relative pressure difference among each of the vacuum processing vessels 103a to 103e. By controlling the pressure as above, outflow of the atmosphere in the vacuum processing vessels 103a to 103e is prevented.

The purge line 124 provided in the first vacuum transfer chamber 104 is controlled so as to function both during the wafer processing and opening to the atmospheric air. Moreover, the exhaust line composed of the dry pump 121, the valve 122, and the exhaust pipeline 123 is not used except when the second vacuum transfer chamber 110 is opened to the atmospheric air and either one of the gate valves 120f and 120g arranged on the both ends of the vacuum transfer intermediate chamber 111 is closed.

The second vacuum transfer chamber 110 is also provided with the purge line 124, but this purge line 124 is controlled by the control portion so as not to be used except when the first vacuum transfer chamber 104 is opened to the atmospheric air and either one of the gate valves 120f and 120g arranged on the both ends of the vacuum transfer intermediate chamber 111 is closed. Moreover, the exhaust line composed of the dry pump 121, the valve 122, and the exhaust pipeline 123 is controlled so as to function both during the wafer processing and opening to the atmospheric air. The vacuum transfer intermediate chamber 111 is not provided with the purge line or the exhaust line.

In a state in which both of the first vacuum transfer chamber 104 and the second vacuum transfer chamber 110 are kept in the vacuum state and the wafer can be transferred any time, the inactive gas emitted from the purge line 124 provided in the first vacuum transfer chamber 104 is exhausted to the first vacuum transfer chamber 104 as illustrated by an arrow in FIG. 2, moves to the second vacuum transfer chamber 110 through the vacuum transfer intermediate chamber 111, and exhausted by the exhaust line through the exhaust pipeline 123 provided in the second vacuum transfer chamber 110. By means of such control, the pressure of the second vacuum transfer chamber 110 in the first vacuum transfer chamber 104, the second vacuum transfer chamber 110, and the vacuum transfer intermediate chamber 111 is controlled so as to be relatively low and then, the pressure is controlled to be high in the order from the vacuum transfer intermediate chamber 111 and the first vacuum transfer chamber 104. As described above, the vacuum processing vessels 103a to 103e are controlled by the pressure further lower than them.

By referring to FIGS. 1 and 2, under the condition that the vacuum processing vessels 103a to 103e connected to the apparatus are controlled so as to have a pressure relatively lower than the other vacuum transfer chambers 104 and 110 and the vacuum transfer intermediate chamber 111 and moreover, the pressure in each of the vacuum processing vessels 103a to 103e and the vacuum transfer chambers 104 and 110, and the vacuum transfer intermediate chamber 111 is controlled as above, control of the pressure and the gate valves 120f and 120g provided at the both ends of the vacuum transfer intermediate chamber 111 for preventing contamination caused by outflow of the atmosphere in each of the vacuum processing vessels 103a to 103e into the other vacuum transfer chambers and for improving productivity of the apparatus will be described.

Arrows illustrated in FIG. 1 indicate flows of the inactive gas when the pressure is controlled as described in the embodiment in FIG. 2. Since the vacuum processing vessels 103a to 103e have the pressure relatively lower than the pressures of the first vacuum transfer chamber 104, the second vacuum transfer chamber 110, and the vacuum transfer intermediate chamber 111, a processing gas or a foreign substance which might affect the other vacuum transfer chambers used in the wafer processing is not taken out toward any of the vacuum transfer chambers.

The first vacuum transfer chamber 104 transfers the wafer processed in the vacuum processing vessels 103a and 103b connected thereto and also transfers the wafer processed in the second vacuum transfer chamber 110 and thus, as compared with the second vacuum transfer chamber 110, an out gas emitted from the wafer and a foreign substance can collect more easily. However, the inactive gas emitted from the purge line 124 provided in the first vacuum transfer chamber 104 moves to the second vacuum transfer chamber 110 through the vacuum transfer intermediate chamber 111 and is exhausted by the exhaust line provided in the second vacuum transfer chamber 110. Therefore, it is not like that only the first vacuum transfer chamber 104 is contaminated, that is, contamination of the entire apparatus caused by the out gas or foreign substance of the wafer is distributed, and improvement of yield and suppression on down time of the apparatus can be realized, and processing efficiency of the wafer can be improved. Moreover, since the pressure of the vacuum processing vessels 103a to 103d is suppressed to be relatively lower than the other vacuum transfer chambers 104 and 110 and the vacuum transfer intermediate chamber 111, even if in either one of the vacuum processing vessels 103a and 103b connected to the first vacuum transfer chamber 104 and any one of the vacuum processing vessels 103c to 103e connected to the second vacuum transfer chamber 110, carrying in/out of the wafer with respect to the two vacuum processing vessels is performed in the same time zone, there is no need to execute control so that the gate valves 120f and 120g provided on the both ends of the vacuum transfer intermediate chamber 111 are closed. When the case in which the gate valves 120f and 120g arranged on the both ends of the vacuum transfer intermediate chamber 111 are open all the time is compared with the case not so, time required for transfer of the wafer to the other vacuum transfer chamber is shorter in the case of all-the-time open, and transfer efficiency is improved. By executing the control as above, when the wafer is to be transferred from either one of the vacuum transfer chamber to the other vacuum transfer chamber through the vacuum transfer intermediate chamber 111, time required for opening/closing of the gate valves 120f and 120g provided on the both ends of the vacuum transfer intermediate chamber 111 can be reduced, and the number of wafers that can be processed in a unit time can be improved.

By means of the control as above, since a certain path is provided for the purge gas introduced from the first vacuum transfer chamber 104 to be exhausted all the time, and the pressure in each of the vacuum transfer chambers is held relatively higher than the other vacuum processing vessels 103a to 103e, contamination caused by outflow of the atmospheric air of each of the vacuum processing vessels 103a to 103e into the other vacuum transfer chambers and vacuum processing vessels can be prevented, and processing capability of the wafer per installation area of the vacuum processing apparatus can be improved.

What is claimed is:

1. A vacuum processing apparatus, comprising:
  a plurality of vacuum transfer chambers connected through a vacuum transfer intermediate chamber; and
  a plurality of vacuum processing vessels which are each connected to the vacuum transfer chambers, and have a processing chamber inside of which a sample is processed; and
  a control unit controlling an introduction of a purge gas into a first vacuum transfer chamber from among the plurality of the vacuum transfer chambers and an exhaustion of the purge gas from a second vacuum transfer chamber from among the plurality of the vacuum transfer chambers while (i) the plurality of the vacuum transfer chambers are in communication with each other through a vacuum transfer intermediate chamber and (ii) an exhaustion of the purge gas from the first vacuum transfer chamber is stopped,
  the vacuum transfer intermediate chamber being between the plurality of the vacuum transfer chambers, and
  in each of the plurality of the vacuum transfer chambers, the samples being transferred to and from the processing chamber of the each of the plurality of vacuum processing vessels.

2. The vacuum processing apparatus according to claim 1, wherein a pressure in the processing chamber of the plurality of vacuum processing vessels is lower than a reduced pressure of the plurality of vacuum transfer chambers.

3. A vacuum processing apparatus, comprising:
  a lock chamber connected to and arranged on a rear of an atmospheric air transfer portion;
  a first vacuum transfer vessel connected to and arranged on a rear of the lock chamber, wherein the first vacuum transfer vessel includes a first vacuum transfer chamber inside of which a sample is transferred;
  a first inactive gas supplying device through which an inactive gas is supplied into the first vacuum transfer chamber;
  a first vacuum exhaust device connected to the first vacuum transfer vessel;
  a first processing vessel connected to and arranged on a horizontal side of the first vacuum transfer vessel, wherein the first processing vessel includes a first vacuum processing chamber inside of which the sample is processed;
  a vacuum transfer intermediate chamber connected to and arranged on a rear of the first vacuum transfer vessel;

a second vacuum transfer vessel connected to and arranged on a rear of the vacuum transfer intermediate chamber, wherein the second vacuum transfer vessel includes a second vacuum transfer chamber inside of which the sample is transferred;

a second inactive gas supplying device through which the inactive gas is supplied into the second vacuum transfer chamber;

a second vacuum exhaust device connected to the second vacuum transfer vessel; and a second processing vessel connected to and arranged on a horizontal side of the second vacuum transfer vessel, wherein the second processing vessel includes a second vacuum processing chamber inside of which the sample is processed; and a control unit controlling supplying of the inactive gas from the first inactive gas supplying device to the first vacuum transfer chamber and exhausting of the inactive gas from the second vacuum transfer chamber by the second vacuum exhaust device, in a state in which (i) the first and second vacuum transfer chambers are in communication with each other through the vacuum transfer intermediate chamber by an open gate valve leading to the vacuum transfer intermediate chamber and (ii) both supplying the inactive gas from the second inactive gas supply device to the second vacuum transfer chamber and exhausting of the inactive gas from the first vacuum transfer chamber by the first vacuum exhaust device are stopped.

4. A method of operating a vacuum processing apparatus having a plurality of vacuum transfer chambers connected through a vacuum transfer intermediate chamber, said method comprising:

supplying of a purge gas into a first vacuum transfer chamber from among the plurality of the vacuum transfer chambers and exhausting the purge gas from a second vacuum transfer chamber from among the plurality of the vacuum transfer chambers while (i) the plurality of the vacuum transfer chambers are in communication with each other through the vacuum transfer intermediate chamber and (ii) exhausting the purge gas from the first vacuum transfer chamber is stopped, wherein the vacuum processing apparatus includes a plurality of vacuum processing vessels which are connected to the vacuum transfer chambers, the plurality of vacuum processing vessels each have a processing chamber inside of which samples are processed, and in each of the plurality of vacuum transfer chambers, the samples are transferred to and from the processing chamber of each of the plurality of vacuum processing vessels.

5. The method of operating a vacuum processing apparatus according to claim 1, wherein a pressure in the processing chamber of the plurality of vacuum processing vessels is lower than a decompressed pressure of the plurality of vacuum transfer chambers.

6. A method of operating a vacuum processing apparatus provided with a first vacuum transfer vessel including a first vacuum transfer chamber inside of which a sample is transferred, a vacuum transfer intermediate chamber connected to and arranged on a rear of the first vacuum transfer vessel, and a second vacuum transfer vessel connected to and arranged on a rear of the vacuum transfer intermediate chamber, the second vacuum transfer vessel including a second vacuum transfer chamber inside of which the sample is transferred, the method comprising:

supplying an inactive gas from a first inactive gas supplying device to the first vacuum transfer chamber and exhausting the inactive gas from the second vacuum transfer chamber by a second vacuum exhaust device, in a state in which (i) the first and second vacuum transfer chambers are in communication with each other through the vacuum transfer intermediate chamber by an open gate valve leading to the vacuum transfer intermediate chamber, and (ii) both supplying the inactive gas from a second inactive gas supply device to the second vacuum transfer chamber and exhausting the inactive gas from the first vacuum transfer chamber by a first vacuum exhaust device are stopped, wherein the vacuum processing apparatus further includes, a lock chamber connected to and arranged on a rear of an atmospheric air transfer portion, the first vacuum transfer vessel being connected to and arranged on a rear of the lock chamber;

the first inactive gas supplying device through which the inactive gas is supplied into the first vacuum transfer chamber;

the first vacuum exhaust device connected to the first vacuum transfer vessel;

a first processing vessel connected to and arranged on a horizontal side of the first vacuum transfer vessel, wherein the first processing vessel includes a first vacuum processing chamber inside of which the sample is processed;

the second inactive gas supplying device through which the inactive gas is supplied into the second vacuum transfer chamber;

the second vacuum exhaust device connected to the second vacuum transfer vessel; and a second processing vessel connected to and arranged on a horizontal side of the second vacuum transfer vessel, wherein the second processing vessel includes a second vacuum processing chamber inside of which the sample is processed.

* * * * *